United States Patent [19]

Westphal

[11] Patent Number: 5,666,054

[45] Date of Patent: *Sep. 9, 1997

[54] GRADIENT COILS FOR THERAPY TOMOGRAPHS

[75] Inventor: Michael Westphal, Offenbach, Germany

[73] Assignee: Bruker Analytische Messtechnik GmbH, Rheinstetten, Germany

[*] Notice: The term of this patent shall not extend beyond the expiration date of Pat. No. 5,563,567.

[21] Appl. No.: 560,874

[22] Filed: Nov. 20, 1995

[30] Foreign Application Priority Data

Dec. 21, 1994 [DE] Germany ............... 44 45 747.2

[51] Int. Cl.$^6$ .................. G01R 33/385; H01F 7/20
[52] U.S. Cl. ............................. 324/318; 335/299
[58] Field of Search .......................... 324/300, 307, 324/316, 318, 322; 128/653.2–653.5; 335/299

[56] References Cited

U.S. PATENT DOCUMENTS

| | | |
|---|---|---|
| 5,198,769 | 3/1993 | Frese et al. |
| 5,323,135 | 6/1994 | Schmidt et al. |
| 5,378,989 | 1/1995 | Barber et al. |

FOREIGN PATENT DOCUMENTS

| | | |
|---|---|---|
| 0551517 | 7/1993 | European Pat. Off. |
| 2265986 | 10/1993 | United Kingdom. |
| 2290386 | 12/1995 | United Kingdom. |

*Primary Examiner*—Sandra L. O'Shea
*Assistant Examiner*—Roger C. Phillips
*Attorney, Agent, or Firm*—Paul J. Vincent

[57] ABSTRACT

A gradient coil system for the production of a magnetic transverse gradient field $G_x=dB_z/dx$ in an NMR tomograph has axial and transverse access to the measuring volume. The gradient coil system consists of four partial coils ($S_{1x}$, $S_{2x}$, $S_{3x}$, $S_{4x}$) each with two current connections ($A_1$, $A_2$), which are arranged mirror symmetrically with respect to the xy-plane (z=0) and mirror symmetrically with respect to the zy-plane (x=0). Each partial coil comprises winding sections on an inner and on an outer cylinder $Z_{1x}$, $Z_{ax}$) about the z-axis as well as on a radial connecting surface $V_{+x}$, $V_{-x}$ and the radial connecting surfaces $V_{+x}$, $V_{-x}$ of those partial coils ($S_{1x}$, $S_{4x}$; $S_{2x}$, $S_{3x}$) which face each other opposite the xy-plane are essentially identical. An axial gap for free transverse access to the measuring volume remains between the partial coils. Since the winding sections on both cylinders are restricted to z-values which are larger than the distance from the connecting surfaces to z=0, good shielding and linearity is nevertheless achieved.

26 Claims, 4 Drawing Sheets

GRADIENT COILS FOR THERAPY TOMOGRAPHS

BACKGROUND OF THE INVENTION

The invention concerns a gradient coil system for the production of a magnetic transverse gradient field $G_x=dB_z/dx$ in an nuclear magnetic resonance (NFR) tomograph with a main field magnet for the production of a homogeneous static main magnetic field $B_z$ in a measuring volume whose center coincides with an origin of a Cartesian x-, y-, z-coordinate system, wherein the main magnetic field $B_z$ is directed along the z-axis and there exists an axial and a transverse access to the measuring volume, and the magnetic transverse gradient field $G_x$ varies along the x-axis of this coordinate system, wherein the gradient coil system comprises four partial coils ($S_{1x}$, $S_{2x}$, $S_{3x}$, $S_{4x}$) each having two current connections ($A_1$, $A_2$), which are arranged mirror symmetrically with respect to the xy-plane (z=0) and mirror symmetrically with respect to the zy-plane (x=0), wherein each partial coil contains winding sections on an inner and on an outer cylinder $Z_{1x}$, $Z_{ax}$ extending about the z-axis and, in each case, in a radial connecting plane $V_{+x}$, $V_{-x}$ essentially parallel to the xy-plane, wherein the winding sections of each partial coil have current flowing through them in series during operation and wherein the radial connecting planes $V_{+x}$, $V_{-x}$ of those partial coils ($S_{1x}$, $S_{4x}$; $S_{2x}$, $S_{3x}$) which lie across from each other relative to the xy-plane are separated from another.

A gradient coil system of this kind is, for example, known from U.S. Pat. No. 5,414,360.

Whereas in the past, tomography systems have been used practically exclusively for diagnosis purposes, in the future there is an ever increasing demand for combined systems, where therapeutic measures can instantly be followed and controlled by means of tomography devices. Numerous therapeutic measures, as for example surgical, in particular micro-surgical operations or radiation treatments, require as unobstructed an access to the patient as possible. However, in conventional NMR systems this access is blocked by all three field-generating components, that is by the main field magnet, the gradient coil system as well as by the rf resonator.

With respect to the main field magnet the problem is already solved, for example by a magnet system known from U.S. Pat. No. 5,168,211 with a transverse field coil similar to a Helmholtz coil, which, because of its construction principle, represent particularly little obstruction for the free side access to the measuring volume.

The problem of unobstructed side access through the rf resonator has, for example, been solved in the U.S. Pat. No. 5,414,360 by means of the asymmetric saddle coil described in this reference, whereby the feature of a sufficient homogeneity of the generated rf field, important for a tomograph, is provided for.

In order to enable performance of minimal-invasive methods (so-called "key-hole surgery") where due to the lack of a direct field of view onto the operating zone and because of the sometimes very small operation opening of the patient, NMR monitoring is a decisive help to the operator for on-line observance during the operation, the transverse access to the measuring volume inside the NMR apparatus with a sidewise angle of access being as large as possible, should not possibly be obstructed by the gradient coil system.

For example from U.S. Pat. No. 4,486,711, a gradient coil system in the form of single or multiple saddle coils is known, which face each other pairwise on an azimuthal section about the z-axis. Such a gradient coil system is located in the axial bore of the main field magnet and generally penetrates the axial region around the coordinate center, i.e. just including also a lateral gap which is kept free by the above-mentioned special configuration of the main field magnet and the rf resonator. Since the known transverse gradient coils, in particular the shielding coils generally used in combination with these, have their highest winding density just in the region of the central plane z=0, the advantage of transparency and possibility of patient manipulation due to the special configuration of main field magnet and rf coil system is again lost completely. On the other hand, a spatial arrangement of the known saddle coils, which are only located on cylinder surfaces about the z-axis and with the limiting condition that no coil part protrudes into the gap region, would lead to strong non-linearities of the gradient fields generated, to very weak gradient strengths and to large stray fields in the region of the cryostat, i.e. to the generation of eddy currents during gradient switching, which for their part can disturb the homogeneity of the static magnetic field $B_0$ in the measuring volume.

From U.S. Pat. No. 5,198,769, tesseral gradient coils for NMR tomography apparatuses are known where partial coils of the gradient coil system face each other symmetrically to the z=0 plane and to a plane perpendicular thereto, for example y=0, which each comprise two azimuthal segments with different radial distances $r_1$ and $r_2$ from the z-axis, which each comprise the same z-position. By this configuration, the parasitic magnetic field generated by the gradient coil system with field components perpendicular to the z-axis, which induces currents in the measuring object and in the cryostat of the main field magnet, shall be considerably reduced. With a set of two coils of this kind on both sides (with respect to the xy-plane) of the above-mentioned access gap to the measuring volume of the measuring device, one could theoretically construct a gradient coil system with an unobstructed transverse access to the measuring volume and with an axial bore to accept the patient. However, the linearity of such a coil configuration is severely limited.

In U.S. Pat. No. 5,414,360 mentioned above, an NMR measuring device with a gradient coil system had been improved in that x- and y-gradients can be generated simultaneously and in that the tesseral gradient coils generate on the one hand a magnetic gradient field inside the measuring volume which is as linear as possible and that on the other hand there is little or no obstruction at all of a tesseral or oblique access to the measuring volume, thereby enabling free access to the measuring volume.

This purpose had been achieved in that each partial coil comprises several windings and that both azimuthal segments exhibit an axial distance from each other in the direction of the z-axis, wherein the radially outer segment with the radial distance $r_2$ from the z-axis is with respect to the z-axis axially closer to the coordinate center than the radially inner segment with the radial distance $r_1$ from the z-axis, and wherein both segments are connected by conductor segments and are both commonly located on a rotational symmetric or ellipsoidal surface r(z). Such a configuration can generate a tesseral gradient field whose linearity inside the measuring volume is comparable to that of tesseral gradient fields generated by classical saddle coils or streamline coils, whereby the side access to the measuring volume is not obstructed by the gradient coil system and with the further advantage of a parasitic contribution of radial field components of the gradient field produced outside the measuring volume which is small.

Because of the arrangement of all conductor elements of, for example, an x-gradient coil on a rotationally symmetric surface $r_x(z)$, all partial coils of this gradient coil can, for example, be mounted on the surface of a nearby mounting surface $r_{x1}$. The surface of all components of the completed x-gradient coil then again represents a similar and nearby surface, at which the partial coils of the y-gradient coils—each one rotated by 90° with respect to the corresponding partial coils of the x-gradient coil- can be attached and fixed. By means of field calculations one could show that such coil systems lead to quite satisfactory imaging performance.

However, in the conventional gradient coil systems for tomography systems with side access, the inductance for given gradient strength per unit current is quite large. In addition, the system is not shielded to the outside, or only by additional shielding coils, possibly leading to considerable eddy current problems during gradient switching.

In order to shield the outwardly directed effect of the gradient coils, in many known systems active shielding coils for each partial coil of the gradient coil system are provided for, which comprise a larger radial distance from the z-axis than the gradient coils themselves. For example from U.S. Pat. No. 5,323,135, a transverse gradient coil system to generate an x-gradient $G_x$ is known which, apart from the four partial coils for the generation of the x-gradient $G_x$, comprise four further partial coils for shielding the gradient coils. Altogether, the known x-gradient coil system comprises eight partial coils, of which the actual gradient coils are located on an inner cylinder, and the shielding coils on an outer cylinder about the z-axis.

A disadvantage of these known gradient coil system is that only the partial coil regions which are positioned in the vicinity of the xy-plane (z=0) are helpful in generating the transverse gradient. The return sections of the partial coils are in contrast useless or even destructive with respect to the linearity of the transverse gradient to be generated. In addition, these return sections add to the electrical resistance as well as to the total inductance and to the total length of the gradient coil system.

In this respect, the gradient coil system according to GB 22 65 986 A represents an improvement. Per gradient direction, the system presented there comprises only four partial coils instead of eight, whereby each coil comprises two cylindrical sections and a planar section in a plane perpendicular to the z-axis, connecting both cylindrical sections. In contrast to the configuration of U.S. Pat. No. 5,323,135, the return arcs are, in a certain sense, guided in a plane radially outwards and close on a shielding cylinder with larger radius. Thereby, the connecting plane V of the sections of each partial coil is always on the part of the coil facing away from the xy-plane. It is therefore at maximum distance from the central plane.

The gradient coil system according to GB 22 65 986 A comprises smaller resistance, a smaller inductance and a smaller axial extension along the z-axis than, for example, the system described in U.S. Pat. No. 5,323,135. Moreover, this gradient coil system yields transverse gradients with better linearity and no "gradient reversal" is observed in the region of the return arcs.

In GB 22 65 986 A only configurations are described where the shielding windings located on the outer cylinder extend from the radial connecting surface V to the central plane (z=0). The connecting surfaces V of both cylinders, where the radial sections of the respective partial coil windings are located, has therefore maximum distance from the xy-plane. In general, such a configuration does not perfectly shield the effect of the transverse gradient towards the outside, since in the region of the respective connecting surface V unshielded stray fields remain which can only be compensated by currents which, seen from the central plane (z=0), would have to flow on the other side of the connecting surface V. With the gradient coil configuration according to GB 22 65 986 A, this is, however, not possible.

In this conventional gradient system according to GB 33 65 986 A, there is no remaining transverse access.

It is therefore the purpose of the present invention to present a gradient coil system of the above mentioned kind, which in addition to a small inductance also comprises a good efficiency as well as good shielding.

SUMMARY OF THE INVENTION

This purpose is achieved in accordance with the invention in a manner as surprisingly simple as effective in that the partial coils ($S_{1x}$, $S_{2x}$, $S_{3x}$, $S_{4x}$) are configured in such a fashion that the winding sections on the inner and outer cylinders $Z_{ix}$, $Z_{ax}$ are axially further separated from the xy-plane than the corresponding radial connecting surface $V_{+x}$, $V_{-x}$.

The cylinders are not necessarily circular cylinders but can comprise a deviating, e.g. elliptical, cross-section. Therefore, if here and in the following the expression radius is used, the distance of the cylinder surface from the axis averaged over the cylinder circumference is meant.

Preferably, the axial distance $d_{Vx}$ of the radial connecting surfaces $V_{+x}$, $V_{-x}$ is within a range from 0.8 to 1.45 times the radius $R_{ax}$ of the outer cylinder.

In this way, with a sufficiently large transverse access, coil configurations become possible with particularly good linearity as well as with particularly small inductance for predetermined gradient strength per unit current.

Preferably, the radius $R_{ix}$ of the inner cylinder $Z_{ix}$ is between 0.35 and 0.8 times the radius $R_{ax}$ of the outer cylinder $Z_{ax}$.

In this way, in combination with a sufficiently large axial access, coil configurations are possible with particularly good linearity as well as particularly small inductance for predetermined gradient strength per unit current.

In a particularly preferred embodiment, the axial distance $d_{Vx}$ of the connecting surfaces $V_{+x}$, $V_{-x}$ is larger than 30 cm, preferably larger than or equal to 50 cm.

This allows for a good transverse access for monitoring or therapeutic purposes, respectively, for example in combination with whole body imaging of humans.

Thereby the axial distance ($d_{Vx}$) of the connecting surfaces ($V_{+x}$, $V_{-x}$) is approximately equal to the axial extension of the transverse access of the main field magnet.

An embodiment of the gradient coil system according to the invention which can be manufactured particularly easily is preferred where the inner and outer cylinder $Z_{ix}$, $Z_{ax}$ each are circular cylinders about the z-axis.

Preferably, the winding sections of each partial coil on the inner and outer cylinder ($Z_{ix}$, $Z_{ax}$) each comprise about 180°. This has the advantage that for the design of the partial coils, altogether the total circumference of 360° can be used.

Preferably, each of both current connections ($A_1$, $A_2$) of each partial coil is located on the inner cylinder ($Z_{ix}$).

In a particularly preferred embodiment the majority of the winding sections, preferably all of them, on the inner cylinder $Z_{ix}$ have, if the current direction is accounted for, a common azimuthal direction With respect to the z-axis and, as a consequence, are not closed on this cylinder surface.

In this way, the requirements for small inductance and good linearity are particularly well met.

In an additional preferred embodiment, the majority of the winding sections guided across the radial connecting surfaces $V_{+x}$, $V_{-x}$ have, if the current direction is accounted for, a common azimuthal direction which is opposite to the azimuthal direction of the winding sections on the inner cylinder.

In this way, the inductance of such coil configurations is further reduced for predetermined gradient strength per unit current.

In a further preferred embodiment, the azimuthal components of the winding sections guided across the radial connecting surfaces $V_{+x}$, $V_{-x}$ are larger in the radially outer region of the radial connecting surfaces than in the radially inner region of these surfaces.

In this way, a further reduction of the inductance for predetermined gradient strength per current unit is achieved.

In an additional preferred embodiment the majority of the winding sections on the outer cylinder $Z_{ax}$ has, if the current direction is accounted for, a common azimuthal direction which is opposite to the azimuthal direction of the winding sections on the inner cylinder $Z_{ix}$.

In this way, a particularly good shielding effect of the magnetic field of the gradient coil configuration towards the outside is achieved, e.g. towards the cryostat of the main field magnet.

It is further preferred that the outer cylinder $Z_{ax}$ comprises less windings than the inner cylinder $Z_{ix}$.

This, too, improves the shielding effect further.

In a further preferred embodiment the axially outermost winding sections on the outer cylinder $Z_{ax}$ are further separated from the xy-plane than the axially outermost winding sections on the inner cylinder $Z_{ix}$.

This, too, improves the shielding effect further.

In a further preferred embodiment the distribution of the winding sections on the outer cylinder $Z_{ax}$ is calculated such that axially outside the connecting surfaces $V_{+x}$, $V_{-x}$ there are no radial gradient field components on the cylinder surface.

This, too, improves the shielding effect further.

In embodiments, the coils according to the invention can consist of wire windings, in particular of copper wires. In other embodiments, the coils can, at least partly, consist of so-called "streamline coils" made from completely closed band, preferably from copper sheet metal. Such streamline coils are known from U.S. Pat. No. 5,289,151 and comprise the advantages described in this reference.

The gradient coils according to the invention as well as the compensation, shielding and cylinder coils are usually moulded with resin in a support body in such a way that an axial bore around the z-axis remains open which is suited to accept a human into the tomography system.

In order to be able to make full use of the large transparency advantage with respect to a side access or an oblique access from above in the direction of the measuring volume, as achieved by the design of the gradient coil system according to the invention, it is recommended to use a system according to the above-mentioned U.S. Pat. No. 5,168,211 as a main field coil with a Helmholtz-like configuration of the transverse field coil. The features and advantages of such a main field coil are discussed in detail in the above-mentioned publication the complete contents of which are herein incorporated by reference. Therefore, at this point, a repetition of these features can be omitted.

An x-gradient coil system according to the invention is particularly preferred where also a y-gradient coil system for the generation of a magnetic transverse gradient field $G_y = dB_z/dy$ in y-direction is provided, whose partial coils $S_{1y}$, $S_{2y}$, $S_{3y}$, $S_{4y}$ are arranged rotated by 90° about the z-axis with respect to the x-gradient coil system.

Just as with the x-gradient coil system according to the invention, the y-gradient coil system can consist of four partial coils $S_{1y}$, $S_{2y}$, $S_{3y}$, $S_{4y}$, each with two current connections, which are arranged mirror symmetrically with respect to the xy-plane (z=0) and mirror symmetrically with respect to the zx-plane (y=0), wherein each partial coil comprises only winding sections on an inner and on an outer cylinder $Z_{iy}$, $Z_{ay}$ about the z-axis as well as in a radial connecting surface $V_{+y}$, $V_{-y}$ essentially parallel to the xy-plane, wherein, during operation, current flows serially through the winding sections of each partial coil, and wherein the radial connecting surfaces $V_{+y}$, $V_{-y}$ of those partial coils $S_{1y}$, $S_{2y}$, $S_{3y}$, $S_{4y}$ facing each other on both sides of the zx-plane, are separated.

An improvement of this system is particularly preferred where the y-gradient coil system is configured according to the x-gradient coil system described above. In this way, the advantages described for the gradient coil system according to the invention are also valid for the y-gradient.

An improvement of this gradient coil system is topologically particularly advantageous, where the outer cylinder $Z_{ay}$ of the y-gradient coil system comprises a smaller radius than the outer cylinder $Z_{ax}$ of the x-gradient coil system, where the inner cylinder $Z_{iy}$ of the y-gradient coil system comprises a larger radius than the inner cylinder $Z_{ix}$ of the x-gradient coil system, and where the partial coils $S_{1y}$, $S_{2y}$, $S_{3y}$, $S_{4y}$ of the y-gradient coil system are inserted along the z-direction into the partial coils $S_{1x}$, $S_{2x}$, $S_{3x}$, $S_{4x}$ of the x-gradient coil system.

In order to be able to generate gradient fields in all spatial directions, in a preferred embodiment there is provided for an additional shielded z-gradient coil system for the generation of magnetic gradient fields with an essentially linear behavior across the measuring volume in a direction parallel to the z-axis, which consists of two cylindrical winding pairs about the z-axis arranged mirror symmetrically with respect to the xy-plane, each with a radially inner z-gradient field winding and a radially outer shielding coil winding.

Further advantages of the invention result from the description and the accompanying drawing. The above mentioned features and those to be further described below in accordance with the invention can be utilized individually or collectively in arbitrary combination. The embodiments shown and described are not to be considered as exhaustive enumeration, rather have exemplary character only.

The invention is represented in the drawing and is described and explained in more detail by means of specific embodiments.

DESCRIPTION OF THE PREFERRED EMBODIMENT

Figure 1A:
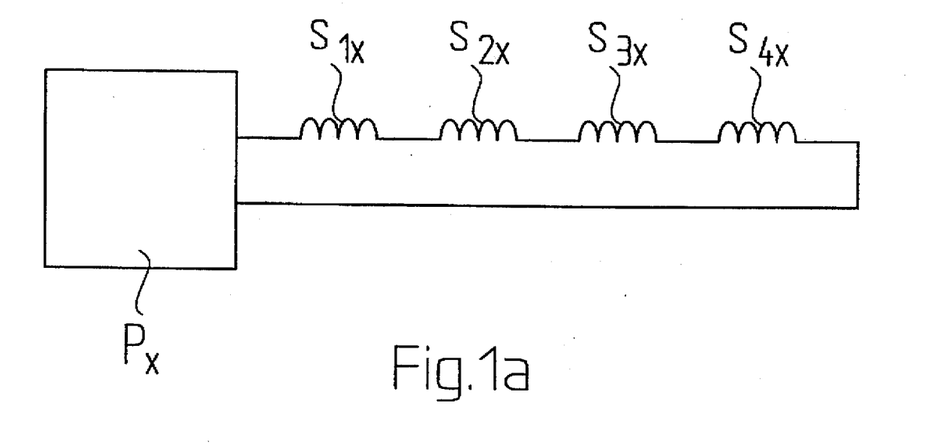
FIG. 1a shows a schematic representation of the electric series connection of a gradient coil system according to the invention along the x-direction.
Figure 1B:
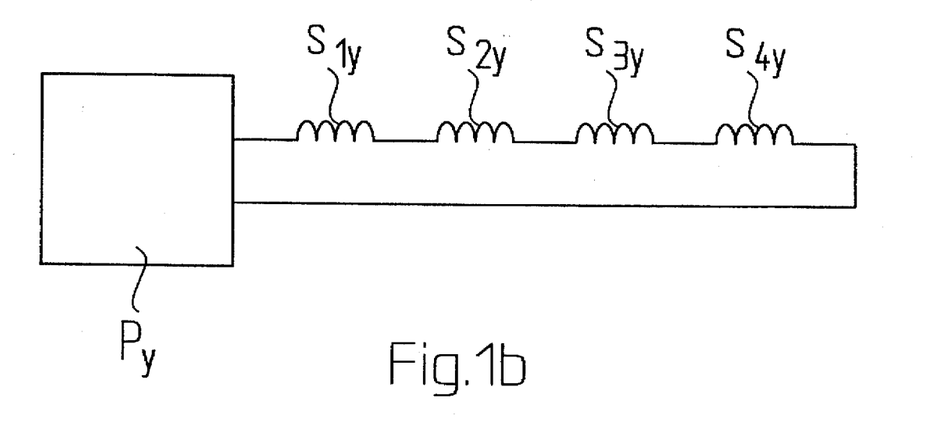
FIG. 1b shows a schematic representation of the electric series connection of a gradient coil system according to the invention along the y-direction.

The electric circuit of a gradient coil system according to the invention represented in FIG. 1a, shows a power supply $P_x$ supplying current to partial coils $S_{1x}$, $S_{2x}$, $S_{3x}$ and $S_{4x}$ electrically connected in series. Correspondingly, the electrical series connection of a y-gradient coil system with the partial coils $S_{1y}$, $S_{2y}$, $S_{3y}'$ and $S_{4y}$ is shown in FIG. 1b as well as its current supply by a further power supply $P_y$.

Figure 2A:
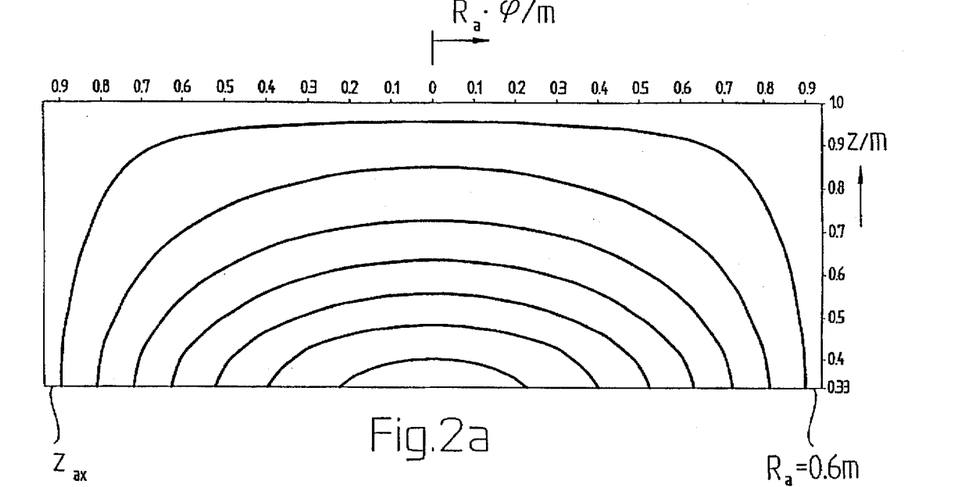
FIG. 2a shows an unfolded representation of a partial coil of the x-gradient coil system according to the invention with the winding sections on the outer cylinder $Z_{ax}$.
Figure 2B:
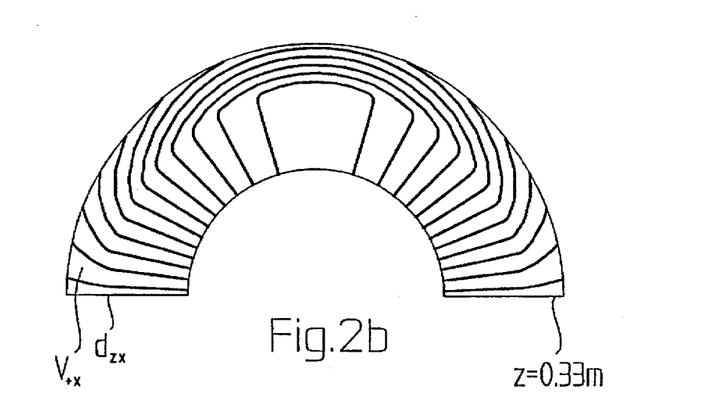
FIG. 2b shows an unfolded representation of a partial coil of the x-gradient coil system according to the invention with the winding sections on a radial connecting surface $V_{+x}$.
Figure 2C:
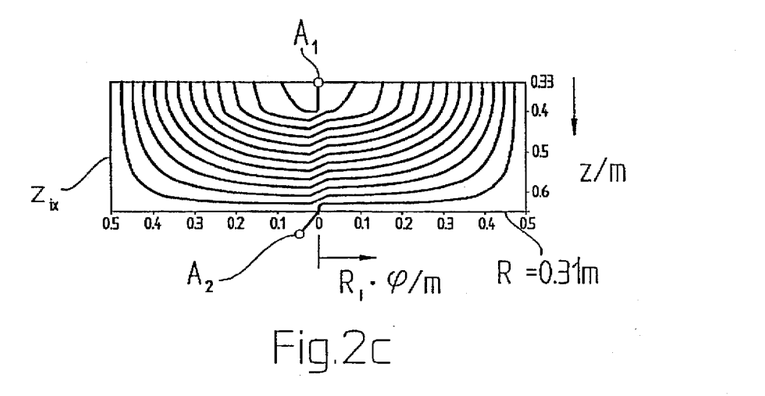
FIG. 2c shows an unfolded representation of a partial coil of the x-gradient coil system according to the invention with the winding sections on the inner cylinder $Z_{ix}$.

FIGS. 2a–2c show planar unfolded representations of the winding section of a partial coil $S_{1x}$ on an outer cylinder $Z_{ax}$ (FIG. 2a), the corresponding winding sections on the—in this embodiment—planar connecting plane $V_{+x}$ between outer cylinder $Z_{ax}$ and inner cylinder $Z_{ix}$ (FIG. 2b) and the unfolded view of the winding sections on the inner cylinder $Z_{ix}$ (FIG. 2c).

For the computation of such winding distributions we refer to known methods, for example to calculation methods according to U.S. Pat. No. 5,323,135. A principal method to calculate the winding configuration of the shielding part of a partial coil, i.e. the arcs on the outer cylinder $Z_{ax}$ would be as follows:

a) One assumes an arbitrary winding configuration of the partial coil on the inner cylinder $Z_{ix}$ according to the respective linearity requirement of the gradient field.

b) In the radial connecting surface, the windings are guided largely radially from the inner cylinder $Z_{ix}$ to the outer cylinder $Z_{ax}$ and are hypothetically closed along the intersection line of the radial connecting surface and the outer cylinder $Z_{ax}$ in azimuthal direction.

c) One imagines a superconducting outer cylinder $Z_{ax}$ arranged around the inner cylinder $Z_{ix}$ extending from infinity to the connecting plane $V_{+x}$, and in which superconducting shielding currents are induced. The current density distribution on the outer cylinder $Z_{ax}$ is approximated by the discrete guiding of the windings on the shielding cylinder, whereby an unavoidable singularity of the calculated current in the connecting surface $V_{+x}$ is neglected. In this way, one obtains a correspondingly optimized winding distribution on the outer cylinder $Z_{ax}$.

In the actual example, $Z_{ix}$ is in the form of a circular cylinder with a radius of 31 cm and extends over a length of 31 cm from z=33 cm to z=64 cm. At z=33 cm, via a planar connecting surface $V_{+x}$, it is connected to the outer cylinder $Z_{ax}$, which, on a radius of 60 cm, extends from z=33 cm to z=100 cm. The winding sections of this partial coil extend about 180° on $Z_{ix}$, $V_{+x}$ and $Z_{ax}$, respectively. The remaining three partial coils of the gradient coil system are analogously configured. Along the z-axis, they leave open a bore with a diameter of 62 cm and a transverse access of 66 cm around the xy-plane.

In the embodiment, each partial coil comprises 12 windings, of which, starting at the connections $A_1$ and $A_2$ on $Z_{ix}$, five are closed on the connecting surface $V_{+x}$ and seven on $Z_{ax}$. The winding sections can be configured as discrete conductors or in the form of streamline coils with broader conductor paths.

In the drawing, the dashed lines connect points which coincide in the non-developed state.

Figure 3:
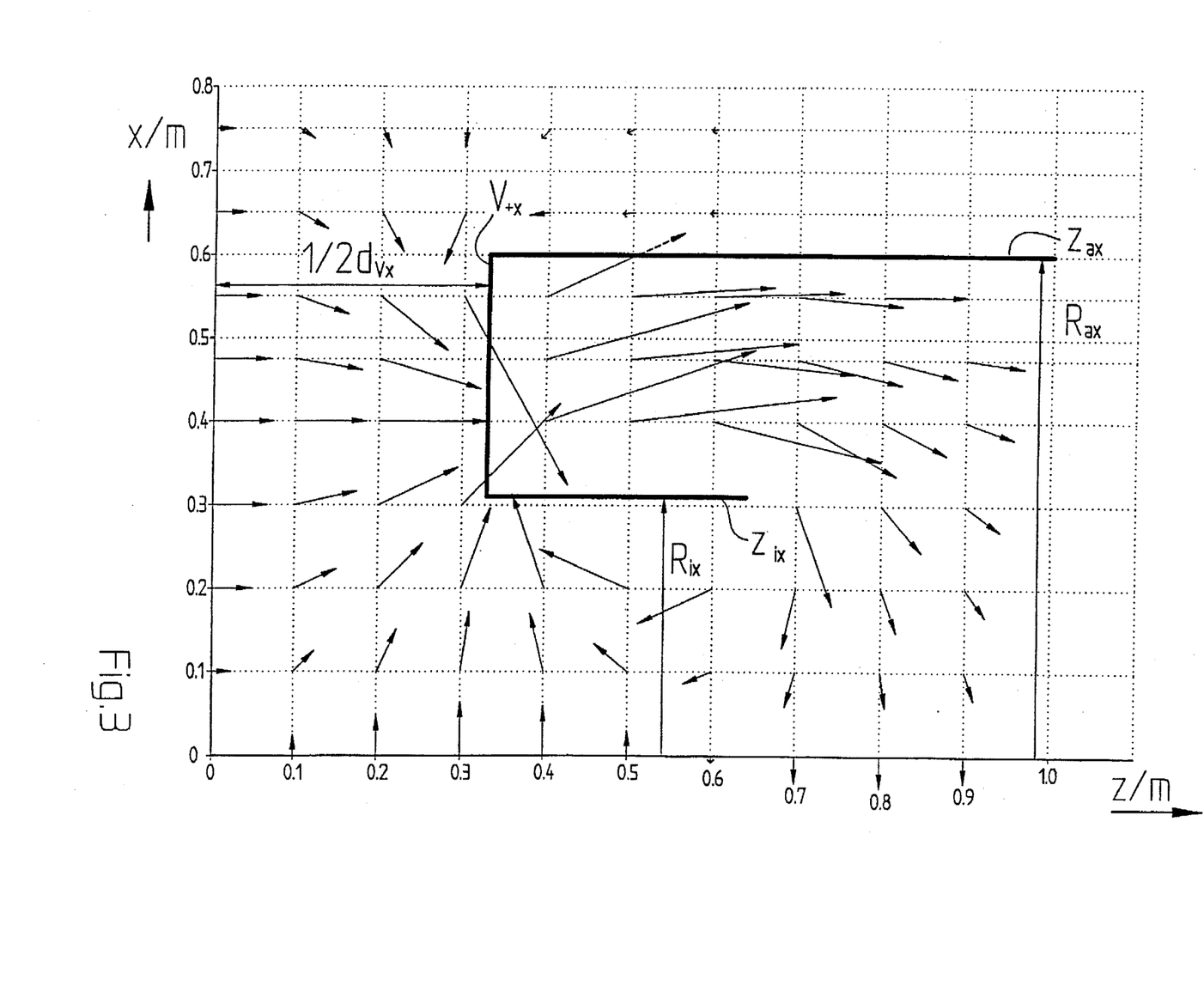
FIG. 3 shows a schematic cross-section across a partial coil of an x-gradient coil system in the zx-plane and field dependence of the magnetic field generated.

In FIG. 3, a schematic cross-section is shown across the zx- or zy-plane, respectively, of one partial coil of an x-gradient coil system with four partial coils according to the invention. Partial coils $S_{1x}$ and $S_{2x}$ or $S_{3x}$ and $S_{4x}$, respectively, face each other. It can be seen that both cylinders $Z_{ix}$ and $Z_{ax}$, starting at the connecting plane $V_{+x}$ extend towards larger z-values, i.e. away from the central plane z=0. The drawn arrows represent the distribution of the magnetic field generated by a corresponding x-gradient coil system with four partial coils whose z-component is the relevant gradient field $G_x$. The outer cylinder is not crossed by field lines. In particular for larger z-values, this leads to a very good shielding behavior. Only in the region of the gap around z=0, field lines protrude to a small extent.

Figure 4:
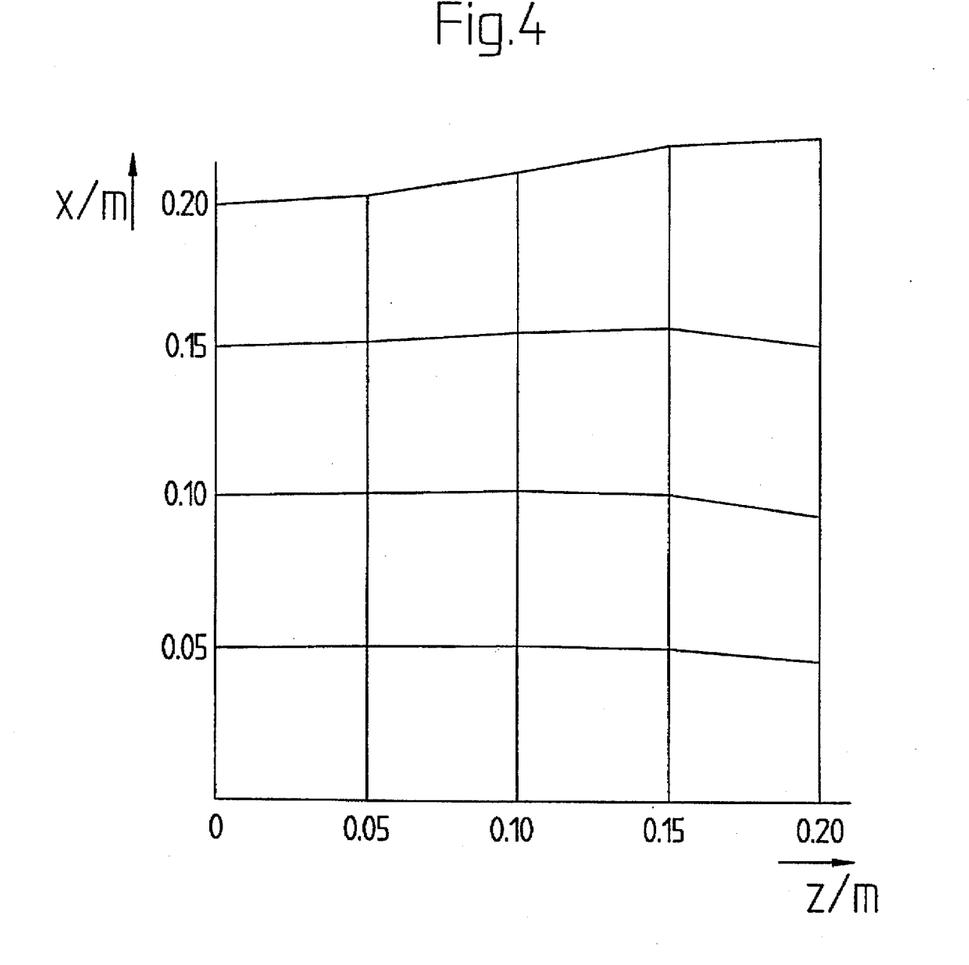
FIG. 4 shows the calculated imaging behavior in the zx-plane of the gradient system according to the invention.

Finally, FIG. 4 shows the imaging behavior in the xz-plane of an x-gradient coil according to the invention. As can be seen, there are distortions of the displayed square grid only for large distances from the coordinate center.

Because of the unobstructed side access to the measuring volume, the gradient system according to the invention described above in combination with open NMR tomography systems provides very good working conditions for doctors in the field of diagnosis and surgery.

I claim:

1. A gradient coil system for the production of a magnetic transverse gradient field $G_x=dB_z/dx$ in a nuclear magnetic resonance (NMR) tomograph with a main field magnet for the production of a homogeneous static main magnetic field $B_z$ in a measuring volume whose center coincides with an origin of a Cartesian x-, y-, z-coordinate system, wherein the main magnetic field $B_z$ is directed along the z-axis, and the magnetic transverse gradient field $G_x$ varies along the x-axis of this coordinate system, wherein the gradient coil system comprises four partial coils ($S_{1x}$, $S_{2x}$, $S_{3x}$, $S_{4x}$) each having two current connections ($A_1$, $A_2$) which are arranged mirror symmetrically with respect to the xy-plane (z=0) and mirror symmetrically with respect to the zy-plane (x=0), wherein each partial coil contains winding sections on an inner and on an outer cylinder ($Z_{ix}$, $Z_{ax}$) extending about the z-axis and, in each case, in a radial connecting plane ($V_{+x}$, $V_{-x}$) essentially parallel to the xy-plane, wherein the winding sections of each partial coil have current flowing through them in series during operation and wherein the radial connecting planes ($V_{+x}$, $V_{-x}$) of those partial coils ($S_{1x}$, $S_{4x}$; $S_{2x}$, $S_{3x}$) which lie across from each other relative to the xy-plane are separated from another, and wherein the partial coils ($S_{1x}$, $S_{2x}$, $S_{3x}$, $S_{4x}$) are configured such that the winding sections on the inner and on the outer cylinder ($Z_{ix}$, $Z_{ax}$) are axially more distant from the xy-plane than the corresponding radial connecting surface ($V_{+x}$, $V_{-x}$).

2. Gradient coil system according to claim 1, wherein the axial distance ($d_{Vx}$) of the radial connecting surfaces ($V_{+x}$, $V_{-x}$) are in a range between 0.8 and 1.45 times the radius ($R_{ax}$) of the outer cylinder ($Z_{ax}$).

3. Gradient coil system according to claim 2, wherein the radius of the inner cylinder ($Z_{ix}$) is between 0.35 and 0.8 times the radius $R_{ax}$ of the outer cylinder ($Z_{ax}$).

4. Gradient Coil system according to claim 3, wherein the axial distance ($d_{Vx}$) of the connecting surfaces ($V_{+x}$, $V_{-x}$) is larger than 30 cm.

5. Gradient coil system according to claim 4, wherein the inner and the outer cylinder ($Z_{ix}$, $Z_{ax}$) each are circular cylinders about the z-axis.

6. Gradient coil system according to claim 1, wherein the axially outermost winding sections on the outer cylinder ($Z_{ax}$) are further separated from the xy-plane than the axially outermost winding sections on the inner cylinder ($Z_{ix}$).

7. Gradient coil system according to claim 1, wherein both current connections ($A_1$, $A_2$) are located on the inner cylinder ($Z_{ix}$).

8. Gradient coil system according to claim 1, wherein the outer cylinder ($Z_{ax}$) comprises less winding sections than the inner cylinder ($Z_{ix}$).

9. Gradient coil system according to claim 1, wherein the partial coils ($S_{1x}$, $S_{2x}$, $S_{3x}$, $S_{4x}$) are so-called streamline coils with current conducting sheets and quasi-continuous current distribution.

10. Gradient coil system according to claim 1, wherein the distribution of the winding sections on the outer cylinder ($Z_{ax}$) is calculated such that there are no radial gradient field components on the cylinder surface axially outside the connecting surfaces ($V_{+x}$, $V_{-x}$).

11. Gradient coil system according to claim 1, wherein the winding sections of the partial coils on the inner ($Z_{ix}$), on the outer cylinder ($Z_{ax}$) and on the connecting surface ($V_{+x}$, $V_{-x}$) each extend about approximately 180°.

12. Gradient coil system according to claim 1, wherein all winding sections on the inner cylinder ($Z_{ix}$) comprise a common azimuthal direction with respect to the z-axis, if the current direction is taken into account.

13. Gradient coil system according to claim 12, wherein all winding sections on the radial connecting surfaces ($V_{+x}$, $V_{-x}$) comprise a common azimuthal direction, if the current direction is taken into account, which is opposite to the azimuthal direction of the winding sections on the inner cylinder.

14. Gradient coil system according to claim 13, wherein the azimuthal components of the winding sections on the radial connecting surfaces ($V_{+x}$, $V_{-x}$) are larger in the radially outer region of the radial connecting surfaces than at the radially inner region of these surfaces.

15. Gradient coil system according to claim 14, wherein all winding sections on the outer cylinder ($Z_{ax}$) comprise a common azimuthal direction, if the current direction is accounted for, which is opposite to the azimuthal direction of the winding sections on the inner cylinder ($Z_{ix}$).

16. Gradient coil system according to claim 1, wherein a y-gradient coil system is provided to generate a magnetic transverse gradient field ($G_y=dB_z/dy$) in y-direction, whose partial coils ($S_{1y}$, $S_{2y}$, $S_{3y}$, $S_{4y}$) are rotated about the z-axis by 90° with respect to the x-gradient coil system.

17. Gradient coil system according to claim 16, wherein the y-gradient coil system consists of four partial coils ($S_{1y}$, $S_{2y}$, $S_{3y}$, $S_{4y}$), each with two current connections which are arranged mirror symmetrically with respect to the xy-plane (z=0) and mirror symmetrically with respect to the zx-plane (y=0), wherein each partial coil comprises only winding sections on an inner and on an outer cylinder ($Z_{iy}$, $Z_{ay}$) about the z-axis as well as in a radial connecting surface ($V_{+y}$, $V_{-y}$) parallel to the xy-plane, wherein, during operation, current flows serially through the winding sections of each partial coil, and wherein the radial connecting surfaces ($V_{+y}$, $V_{-y}$) of those partial coils ($S_{1y}$, $S_{2y}$, $S_{3y}$, $S_{4y}$) facing each other on both sides of the zx-plane, are separated from another.

18. Gradient coil system according to claim 17, wherein the outer cylinder ($Z_{ay}$) of the y-gradient coil system has a smaller radius than the outer cylinder ($Z_{ax}$) of the x-gradient coil system, the inner cylinder ($Z_{iy}$) of the y-gradient coil system has a larger radius than the inner cylinder ($Z_{ix}$) of the x-gradient coil system, and the partial coils ($S_{1y}$, $S_{2y}$, $S_{3y}$, $S_{4y}$) of the y-gradient coil system are inserted along the z-direction into the partial coils. ($S_{1x}$, $S_{2x}$, $S_{3x}$, $S_{4x}$) of the x-gradient coil system.

19. Gradient coil system for the production of a magnetic transverse gradient field $G_x=dB_z/dx$ in an nuclear magnetic resonance (NMR) tomograph with a main field magnet for the production of a homogeneous static main magnetic field $B_z$ in a measuring volume whose center coincides with an origin of a Cartesian x-, y-, z-coordinate system, wherein the main magnetic field $B_z$ is directed along the z-axis, and the magnetic transverse gradient field $G_x$ varies along the x-axis of this coordinate system, wherein the gradient coil system comprises four partial coils ($S_{1x}$, $S_{2x}$, $S_{3x}$, $S_{4x}$) each having two current connections ($A_1$, $A_2$) which are arranged mirror symmetrically with respect to the xy-plane (z=0) and mirror symmetrically with respect to the zy-plane (x=0), wherein each partial coil contains winding sections on an inner and on an outer cylinder ($Z_{ix}$, $Z_{ax}$) extending about the z-axis and, in each case, in a radial connecting plane ($V_{+x}$, $V_{-x}$) essentially parallel to the xy-plane, wherein the winding sections of each partial coil have current flowing through them in series during operation and wherein the radial connecting planes ($V_{-x}$, $V_{-x}$) of those partial coils ($S_{1x}$, $S_{4x}$; $S_{2x}$, $S_{3x}$) which lie across from each other relative to the xy-plane have a distance, and wherein the partial coils ($S_{1x}$, $S_{2x}$, $S_{3x}$, $S_{4x}$) are configured such that the winding sections on the inner and on the outer cylinder ($Z_{ix}$, $Z_{ax}$) are axially more distant from the xy-plane than the corresponding radial connecting surface ($V_{+x}$, $V_{-x}$); the axial distance ($d_{Vx}$) of the radial connecting surfaces ($V_{+x}$, $V_{-x}$) are in a range between 0.8 and 1.45 times the radius ($R_{ax}$) of the outer cylinder ($Z_{ax}$); the radius of the inner cylinder ($Z_{ix}$) is between 0.35 and 0.8 times the radius $R_{ax}$ of the outer cylinder ($Z_{ax}$); the axial distance ($d_{Vx}$) of the connecting surfaces ($V_{+x}$, $V_{-x}$) is larger than 30 cm, the inner and the outer cylinder ($Z_{ix}$, $Z_{ax}$) each are circular cylinders about the z-axis; the axially outermost winding sections on the outer cylinder ($Z_{ax}$) are separated further from the xy-plane than the axially outermost winding sections on the inner cylinder ($Z_{ix}$); the outer cylinder ($Z_{ax}$) comprises less winding sections than the inner cylinder ($Z_{ix}$); the partial coils ($S_{1x}$, $S_{2x}$, $S_{3x}$, $S_{4x}$) are so-called streamline coils with current conducting sheets and quasi-continuous current distribution; the distribution of the winding sections on the outer cylinder ($Z_{ax}$) is calculated such that axially outside the connecting surfaces ($V_{+x}$, $V_{-x}$) there are no radial gradient field components on the cylinder surface; and the winding sections of the partial coils on the inner ($Z_{ix}$), on the outer cylinder ($Z_{ax}$) and on the connecting surface ($V_{+x}$, $V_{-x}$) each extend about approximately 180°.

20. Gradient coil system according to claim 19, wherein all winding sections on the inner cylinder ($Z_{ix}$) comprise a common azimuthal direction with respect to the z-axis, if the current direction is taken into account.

21. Gradient coil system according to claim 20, wherein all winding sections on the radial connecting surfaces ($V_{+x}$, $V_{-x}$) comprise a common azimuthal direction, if the current direction is taken into account, which is opposite to the azimuthal direction of the winding sections on the inner cylinder.

22. Gradient coil system according to claim 21, wherein the azimuthal components of the winding sections on the radial connecting surfaces ($V_{+x}$, $V_{-x}$) are larger in the radially outer region of the radial connecting surfaces than at the radially inner region of these surfaces.

23. Gradient coil system according to claim 22, wherein all winding suctions on the outer cylinder ($Z_{ax}$) comprise a common azimuthal direction, if the current direction is accounted for, which is opposite to the azimuthal direction of the winding sections on the inner cylinder ($Z_{ix}$).

24. Gradient coil system according to claim 19, wherein a y-gradient coil system is provided to generate a magnetic transverse gradient field ($G_y=dB_z/dy$) in y-direction, whose partial coils ($S_{1y}$, $S_{2y}$, $S_{3y}$, $S_{4y}$) are rotated about the z-axis by 90° with respect to the x-gradient coil system.

25. Gradient coil system according to claim 24 wherein the y-gradient coil system consists of four partial coils ($S_{1y}$, $S_{2y}$, $S_{3y}$, $S_{4y}$), each with two current connections which are arranged mirror symmetrically with respect to the xy-plane (z=0) and mirror symmetrically with respect to the zx-plane (y=0), wherein each partial coil comprises only winding sections of an inner and on an outer cylinder ($Z_{iy}$, $Z_{ay}$) about the z-axis as well as in a radial connecting surface ($V_{+y}$, $V_{-y}$) parallel to the xy-plane, wherein, during operation, current flows serially through the winding sections of each partial coil, and wherein the radial connecting surfaces ($V_{+y}$, $V_{-y}$) of those partial coils ($S_{1y}$, $S_{2y}$, $S_{3y}$, $S_{4y}$) facing each other on both sides of the zx-plane, are separated from another.

26. Gradient coil system according to claim 25, wherein the outer cylinder ($Z_{ay}$) of-the y-gradient coil system comprises a smaller radius than the outer cylinder ($Z_{ax}$) of the x-gradient coil system, the inner cylinder ($Z_{iy}$) of the y-gradient coil system comprises a larger radius than the inner cylinder ($Z_{ix}$) of the x-gradient coil system, and the partial coils ($S_{1y}$, $S_{2y}$, $S_{3y}$, $S_{4y}$) of the y-gradient coil system are inserted along the z-direction into the partial coils ($S_{1x}$, $S_{2x}$, $S_{3x}$, $S_{4x}$) of the x-gradient coil system.

* * * * *